(12) United States Patent
Takahashi et al.

(10) Patent No.: US 8,565,509 B2
(45) Date of Patent: Oct. 22, 2013

(54) CIRCUIT PATTERN INSPECTING APPARATUS, MANAGEMENT SYSTEM INCLUDING CIRCUIT PATTERN INSPECTING APPARATUS, AND METHOD FOR INSPECTING CIRCUIT PATTERN

(75) Inventors: Hiroyuki Takahashi, Hitachinaka (JP); Yasuhiro Gunji, Hitachiota (JP); Hirokazu Ito, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 117 days.

(21) Appl. No.: 13/125,718

(22) PCT Filed: Oct. 19, 2009

(86) PCT No.: PCT/JP2009/005431
§ 371 (c)(1),
(2), (4) Date: Jun. 22, 2011

(87) PCT Pub. No.: WO2010/047073
PCT Pub. Date: Apr. 29, 2010

(65) Prior Publication Data
US 2011/0255773 A1    Oct. 20, 2011

(30) Foreign Application Priority Data
Oct. 24, 2008  (JP) ................. 2008-273713

(51) Int. Cl.
*G06K 9/00* (2006.01)
*G06K 9/68* (2006.01)
(52) U.S. Cl.
USPC .......................................... 382/145; 382/218
(58) Field of Classification Search
USPC ............ 382/141, 145, 149, 218, 190; 348/92, 348/125
See application file for complete search history.

(56) References Cited

U.S. PATENT DOCUMENTS

| 5,384,463 A * | 1/1995 | Honjo et al. ................. 250/398 |
| 2006/0023936 A1* | 2/2006 | Fujiwara ....................... 382/149 |
| 2007/0280559 A1 | 12/2007 | Ishitani et al. |
| 2009/0225326 A1 | 9/2009 | Tsuji et al. |

FOREIGN PATENT DOCUMENTS

| JP | 10-334845 A | 12/1998 |
| JP | 11-154481 A | 6/1999 |
| JP | 2000-57985 A | 2/2000 |

(Continued)

OTHER PUBLICATIONS

Asai, et al. (Computer English Translation of Japanese Patent No. JP-10-334845), pp. 1-7, 1998.*

*Primary Examiner* — Daniel Mariam
(74) *Attorney, Agent, or Firm* — Miles & Stockbridge P.C.

(57) ABSTRACT

The operation rate of a circuit pattern inspecting apparatus is prevented from deteriorating by measuring image noise of the circuit pattern inspecting apparatus and detecting the sign that the apparatus is to be in an abnormal state. Provided is the circuit pattern inspecting apparatus wherein circuit pattern abnormalities are detected by irradiating a substrate having a circuit pattern formed thereon with an electron beam and detecting generated secondary electrons or reflected electrons. The circuit pattern inspecting apparatus is provided with: an image processing section wherein an image is generated based on the signal intensities of the detected secondary electrons or those of the reflected electrons and the image is displayed for a display apparatus of the interface; and a control section which analyzes the frequency of noise included in the image.

26 Claims, 7 Drawing Sheets

(56) References Cited

FOREIGN PATENT DOCUMENTS

| JP | 2000-294185 A | 10/2000 |
|----|---------------|---------|
| JP | 2003-197141 A | 7/2003 |
| JP | 2003-278825 A | 10/2003 |
| JP | 2007-207763 A | 8/2007 |
| JP | 2009-212320 A | 9/2009 |
| JP | 2009-266453 A | 11/2009 |

* cited by examiner

CIRCUIT PATTERN INSPECTING APPARATUS, MANAGEMENT SYSTEM INCLUDING CIRCUIT PATTERN INSPECTING APPARATUS, AND METHOD FOR INSPECTING CIRCUIT PATTERN

TECHNICAL FIELD

The present invention relates to a circuit pattern inspecting apparatus for detecting defects in a substrate, a management system including the circuit pattern inspecting apparatus, and a method for inspecting circuit patterns based on an image signal obtained by irradiating an electron beam on the substrate having fine circuit patterns of semiconductor, liquid crystal, and the like.

BACKGROUND ART

A description will be given by taking inspection of a semiconductor wafer, for instance. A semiconductor device is fabricated by repeating steps of transcribing a pattern formed in a photo-mask onto a semiconductor wafer in lithography processes and etching processes. In the fabrication process of semiconductor devices, qualities of the lithography processes, the etching processes, and the like, generation of contaminants, and so forth have large influence upon the yield of the semiconductor devices. Accordingly, in order to detect earlier or in advance such abnormalities and generation of poor quality during fabrication processes as described above, various kinds of apparatuses for inspecting patterns on the semiconductor wafer in the course of fabrication process have been used.

As methods of inspecting defects existing in patterns on the semiconductor wafer, an optical type defect inspecting apparatus and an electron beam type inspecting apparatus have been put into practice. In the former light is irradiated on the semiconductor wafer and defects are detected using an optical image. In the latter an electron beam is irradiated on the semiconductor wafer, a secondary signal of generated secondary electrons, back scattering electrons, and the like, is detected, the signal is converted into an image, and a difference between the image and a comparative image is detected as a defect.

In the aforementioned electron beam type inspecting apparatus, inspection is conducted based on an image obtained by irradiating an electron beam. Accordingly, when noises interfere in the obtained image, a false inspection result is output. Therefore, techniques for reducing the image noise and enhancing the accuracy of inspection have been known (see PATENT LITERATURE 1, for example). However, a technique for studying causes of generation of a noise to be reduced has not been developed yet. Various causes of generating an image noise can be enumerated such as interferences of noises such as mechanical, electrical, and external disturbance and a fault of the apparatus. Therefore, identification of causes of an image noise is very difficult and it requires a long time.

CITATION LIST

Patent Literature

Patent Literature 1: JP-A-2003-197141

SUMMARY OF INVENTION

Technical Problem

The above-described electron beam type inspecting apparatus conducts inspection based on an image obtained by irradiating an electron beam. Accordingly, when noises interfere in the obtained image, a false inspection result is output. Various causes of generating an image noise can be enumerated such as interferences of noises such as mechanical, electrical, and external disturbance and a fault of the apparatus. Therefore, identification of causes of an image noise is very difficult and it requires a long time.

An object of the present invention is to prevent a decrease in the rate of operation of a circuit pattern inspecting apparatus by measuring an image noise of the circuit pattern inspecting apparatus and perceiving a sign that the status of the apparatus will become abnormal.

Solution to Problem

To accomplish the above object, according to an embodiment of the invention, a circuit pattern inspecting apparatus, which detects secondary electrons or back scattering electrons generated by irradiating an electron beam on a substrate having a circuit pattern formed thereon and detects an abnormality of the circuit pattern, comprises an image processing unit for generating an image based on an intensity of a signal of the detected secondary electrons or back scattering electrons and causing the image to be displayed on a display section of an interface, and a control unit for performing a frequency analysis of a noise contained in the image.

Advantageous Effects of Invention

According to the present invention, by measuring an image noise of the circuit pattern inspecting apparatus and perceiving a sign that the status of the apparatus will become abnormal, a judgment can be made as to whether maintenance is necessary or unnecessary and as to contents of the maintenance, thereby ensuring that the rate of operation of the circuit pattern inspecting apparatus can be prevented from being decreased.

DESCRIPTION OF EMBODIMENTS

Embodiments of the present invention will be described in greater detail with reference to the accompanying drawings hereinafter.

Figure 1:
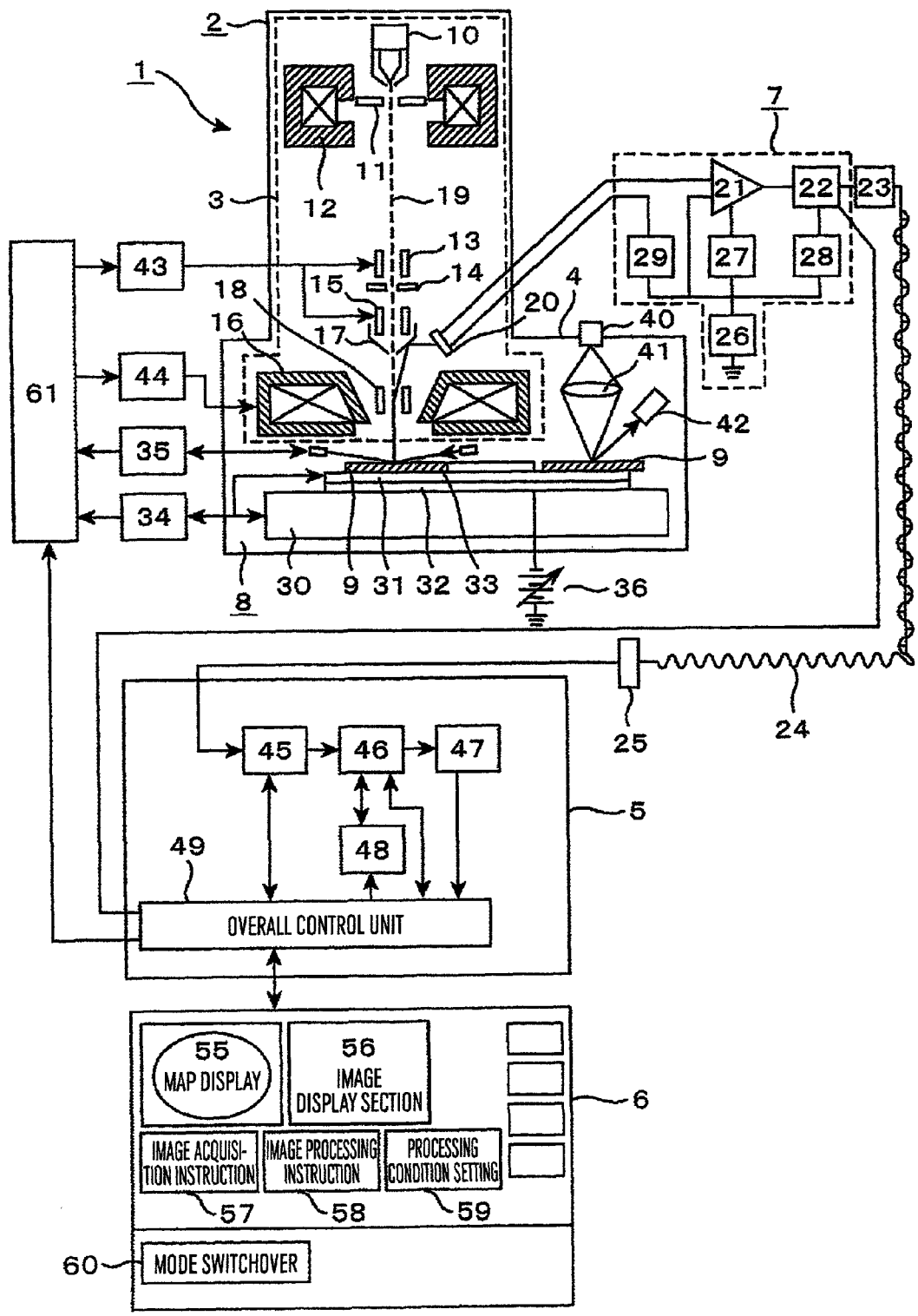
FIG. 1 is a longitudinal sectional diagram illustrating the construction of a circuit pattern inspecting apparatus.

FIG. 1 is a construction diagram of a circuit pattern inspecting apparatus using an electron beam, showing principal constituents in the form of a schematic longitudinal sectional diagram and a functional diagram. A circuit pattern inspecting apparatus 1 comprises an inspection chamber 2 having its interior decompressed to vacuum and a preliminary chamber (not shown) to transfer an inspection object substrate 9 into the inspection chamber 2, with the preliminary chamber being so constructed as to be decompressed to vacuum independently of the inspection chamber 2. The circuit pattern inspecting apparatus 1 further comprises, in addition to the inspection chamber 2 and the preliminary chamber, an image processing unit 5.

An electron optic system column 3, a sample chamber 8, and an optical microscope chamber 4 are broadly included inside the inspection chamber 2. The electron optic system column 3 has an electron gun 10, an extraction electrode 11, a condenser lens 12, a blanking deflector 13, an aperture 14, a scanning deflector 15, an objective lens 16, a reflector plate 17, an E×B deflector 18, and a secondary electron detector 20; it operates to irradiate a primary electron beam 19 on the inspection object substrate 9 and detect secondary electrons generated from the inspection object substrate.

Provided for the sample chamber 8 are a sample stage 30, an X stage 31, a Y stage 32, a rotary stage 33, a position monitor length measuring device 34, and an inspection object substrate height measuring device 35.

The optical microscope chamber 4 is located near by the electron optic system column 3 in the interior of the inspection chamber 2 at a location so spaced apart as not to affect each other. The optical microscope chamber 4 includes a light source 40, an optical lens 41, and a CCD camera 42. The distance between the electron optic system column 3 and the optical microscope chamber 4 is known and the X stage 31 or the Y stage 32 can reciprocate over the known distance between the electron optic system column 3 and the optical microscope chamber 4.

A secondary electron detection unit 7 includes a pre-amplifier 21 for amplifying an output signal from the secondary electron detector 20 and an AD converter 22 which converts the amplified signal from analogue to digital; it further includes a pre-amplifier drive power supply 27, an AD converter drive power supply 28, and a reverse bias power supply 29 which are adapted to drive the individual components as above, and besides, a high voltage power supply 26 adapted to supply electric power to the above power supplies. An amplified digital signal is converted by an optical conversion means 23 into an optical signal which in turn is transmitted through an optical transmission means 24 to an electric conversion means 25 where it is converted to an electrical signal, and the electrical signal is sent to a memory section 45 of the image processing unit 5. Although not illustrated, an optical image the CCD camera 42 obtains is also sent to the image processing unit 5 in a similar way.

The image processing unit 5 includes the memory section 45, an image processing circuit 46, a defect data buffer 47, a calculation section 48, and an overall control unit 49. The signal stored in the memory section 45 is converted into an image signal by the image processing circuit 46. Various image processings for position matching of images apart by specific distant positions, normalization of signal level, and removal of noise signal are applied for the image signal and, then, is subjected to a comparison calculation with another image signal. The calculation section 48 compares an absolute value of a difference image signal resulting from the comparison calculation with a predetermined threshold value, judges as a candidate for defects when a level of the difference image signal level is greater than the predetermined threshold value, and transmits its position, the number of defects, and the like to an interface 6. The overall control unit 49 controls the above image processings and calculations and transmits the situation to a correction control circuit 61. The electron beam image or the optical image is displayed on an image display section 56 of the interface 6.

As for operation commands and operation conditions for the individual components of the circuit pattern inspecting apparatus 1, instruction commands are entered from the interface 6 and sent to the correction control circuit 61 by way of the overall control unit 49 of the image processing unit 5. In the interface 6, conditions such as an acceleration voltage, a deflection width, and a deflection speed at the time of generation of the primary electron beam 19, a timing to fetch a signal of the secondary electron detection unit 7, and moving speeds of the X stage 31 and the Y stage 32 can be set arbitrarily or selectively according to purposes. The interface 6 has the function of display, for example, and a distribution of a plurality of detected defects can be displayed in a map display section 55 as being symbolized on a map schematically indicating a wafer. An image acquisition instruction area 57 is a portion adapted to issue a command to acquire an electron beam image or an optical image in respect of each detected defect or each area. An image processing instruction area 58 is a portion adapted to instruct adjustment of brightness and contrast of the acquired image. A processing condition setting instruction section 59 is a portion adapted to set various conditions such as a deflection width, a deflection speed, a focal distance of the objective lens, and a depth of focus at the time of irradiating the primary electron beam 19 on the inspection object substrate 9.

The correction control circuit 61 controls the acceleration voltage, the deflection width, and the deflection speed at the time of generation of the primary electron beam 19, a timing to fetch a signal of the secondary electron detection unit 7, the moving speeds of the X stage 31 and the Y stage 32, and the like such that they follow instruction commands sent from the overall control unit 49 of the image processing unit 5. Further, it monitors the position and the height of the inspection object substrate 9 based on signals of the position monitor length measuring device 34 and the inspection object substrate height measuring device 35, generates correction signals from the results of monitoring, and sends the correction signals to a scanning signal generator 43 and an objective lens power supply 44, thus changing the deflection width, the deflection speed, and the focal distance of the objective lens in order that the primary electron beam 19 can constantly be irradiated on a correct position.

For the electron gun 10, a diffusion replenishment type thermal-field-emission electron source is used. By using this type of the electron gun 10, a more stable electron beam current than that with the conventional electron source such as, for example, a tungsten filament electron source or a cold-field-emission type electron source and, consequently, an electron beam image with less variations of brightness can be obtained. Further, since the electron beam current can be set high with this type of electron gun 10, a high-speed inspection to be described later can be realized.

The primary electron beam 19 is extracted from the electron gun 10 by applying a voltage across the electron gun 10 and the extraction electrode 11. Acceleration of the primary electron beam 19 is determined by applying a negative potential of a high voltage to the electron gun 10. Thus, the primary electron beam 19 proceeds toward the sample stage 30 with an energy corresponding to the potential, is converged by the condenser lens 12, and further is focused finely by the objective lens 16 so as to be irradiated on the inspection object substrate 9 mounted on the sample stage 30.

The blanking deflector 13 and the scanning deflector 15 are controlled by the scanning signal generator 43 which generates a blanking signal and a scanning signal. The blanking deflector 13 deflects the primary electron beam 19 to prevent it from passing through an opening of the aperture 14 and as a result, the primary electron beam 19 can be prevented from being irradiated on the inspection object substrate 9. The primary electron beam 19 is finely focused by the objective lens 16 and, therefore, it can be scanned on the inspection object substrate 9 by the scanning deflector 15.

In an automatic inspecting apparatus, high inspection rate is indispensable. Accordingly, in contrast to an ordinary SEM, an electron beam of an electron beam current in the order of pA is not scanned at a slow speed, the scanning is not carried out many times, or individual images are not superposed. Further, in order to suppress charge-up on an insulating material, it is necessary to execute electron beam scanning once or a few times at a high speed. Hence, in the present embodiment, a configuration is chosen for an image to be formed by a single scan of an electron beam of a large current of, for example, 100 nA which is about 100 times or more as compared to a normal SEM. Further, scanning is carried out under the condition that the scanning width is, for example, 100 μm, one pixel is 0.1 μm$^2$, and the scanning time for one scan is 1 μs.

The objective lens 16 is connected with the objective lens power supply 44. Also, the condenser lens 12 is connected with a lens power supply, which is not shown. Then, the correction control circuit 61 adjusts the intensities of these lenses by changing the voltages of the lens power supplies.

Negative voltage can be applied by a retarding power supply 36 to the inspection object substrate 9. By adjusting the voltage of the retarding power supply 36, the primary electron beam 19 can be decelerated so that the electron beam landing energy onto the inspection object substrate 9 may be adjusted without changing the potential at the electron gun 10.

The inspection object substrate 9 is mounted on the X stage 31 and the Y stage 32. During execution of inspection, there are available a method of scanning the primary electron beam 19 two-dimensionally while keeping the X stage 31 and the Y stage 32 still and a method of scanning the primary electron beam 19 in the X direction while keeping the X stage 31 still and moving the Y stage 32 continuously in the Y direction at a constant speed. When inspecting a specific, relatively small area, the former method for inspection with the stages kept still is effective; when inspecting a relatively wide area, the latter method for inspection with the stage moved continuously at a constant speed is effective.

When an image of the inspection object substrate 9 is acquired while moving one of the X stage 31 and the Y stage 32 continuously, the primary electron beam 19 is scanned in a direction substantially orthogonal to the moving direction of the stage and then, secondary electrons generated from the inspection object substrate 9 are detected with the secondary electron detector 20 in synchronism with the scanning of the primary electron beam 19 and the movement of the stage. The secondary electrons generated by irradiating the primary electron beam 19 on the inspection object substrate 9 are accelerated with the voltage applied to the inspection object substrate 9. The E×B deflector 18 is arranged above the inspection object substrate 9 and the accelerated secondary electrons are deflected by it to a predetermined direction. By changing the intensity of a magnetic field by a voltage applied to the E×B deflector 18, the amount of deflection can be adjusted. The electromagnetic field of the E×B deflector 18 can be changed along with the voltage applied to the inspection object substrate 9. The secondary electrons deflected by the E×B deflector 18 impinge upon the reflector plate 17 under a predetermined condition. The reflector plate 17 shares the role of a shield pipe to maintain highly accurate deflection of the primary electron beam 19 irradiating on the inspection object substrate 9 by the scanning deflector 15 and it has a conical shape. Bombardment of the accelerated secondary electrons on the reflector plate 17 generates second, secondary electrons having energies of several volts to 50 eV from the reflector plate 17.

In the present embodiment, length measuring devices based on the principle of laser interference are used in both the X direction and the Y direction as the position monitor length measuring device 34 to ensure that positions of the X stage 31 and the Y stage 32 can be measured even during irradiation of the primary electron beam 19; it is configured that measured values can be transmitted to the correction control circuit 61. It is further configured that the numbers of revolutions of the respective drive motors for the X stage 31, the Y stage 32, and the rotary stage 33 can also be transmitted from the driver circuit of the drive motors to the correction control circuit 61. Based on these data the correction control circuit 61 can accurately grasp an area and a position at which the primary electron beam 19 is irradiated and it calculates a difference between the measured value and the controlled value to correct a position drift of the irradiation position for the primary electron beam 19. Further, coordinates of an area where the primary electron beam 19 has been irradiated can be memorized.

Used as the inspection object substrate height measuring device 35 is an optical measuring device, for example, a laser interference measuring device or a reflected light type measuring device which measures a change by a position of a reflected light ray emanates. For example, a method has been known in which an elongated white light ray passing through a slit is illuminated on the inspection object substrate 9 through a transparent window, a position of a reflected light ray is detected by a position detecting monitor, and an amount of height change is calculated from a change in the position. The inspection object substrate height measuring device 35 is mounted on the X stage 31 and the Y stage 32 to measure the height of the inspection object substrate 9. Based on the measurement data of the inspection object substrate height measuring device 35, the focal distance of the objective lens 16 to focus the primary electron beam 19 finely is corrected dynamically so as to focus the primary electron beam 19 on the inspection object area. Also it is possible to configure that a camber and a height distortion of the inspection object substrate 9 have been measured in advance of the irradiation of the primary electron beam 19 and conditions for correcting the objective lens 16 in respect of individual inspection areas can be set based on the measured data.

When a noise interferes in an obtained inspection image in the circuit pattern inspecting apparatus using the electron beam set forth so far, an abnormal signal not existing in the inspection object develops in a difference image between acquired images. When the abnormal signal exceeds an inspection threshold value, it is judged as a defect even though it is not and causes a false report. Accordingly, suppressing a noise in acquired images is a very important problem in performing highly accurate inspection.

Here, a study will be made on causes of noises interfering in acquired images. Factors responsible for noises are mainly classified into electrical noises interfering in the primary electron beam deflection signal and the secondary electron signal and mechanical noises attributable to mechanical vibrations. As noise generation sources of electrical noises a part such as the scanning signal generator 43 or the objective lens power supply 44 which affects the irradiation position of the primary electron beam on the inspection object substrate and a part such as the secondary electron detector 20 or the pre-amplifier 21 which affects the signal intensity of the secondary electron signal can be enumerated. Factors responsible for the electrical noises are mostly represented by power supply noises and noises output by units constituting the apparatus such as detectors and control boards; these noises change little with time. Accordingly, because the noise amount is inherent to each apparatus, the magnitude of the noise can be grasped substantially accurately.

On the other hand, the factor responsible for the mechanical noise is mechanical vibration. In a circuit pattern inspecting apparatus using an electron beam, for the sake of assuring its effective throughput, a method is indispensable in which an image is acquired while moving the stage continuously. Accordingly, acceleration/deceleration of the stage becomes a vibration source and a problem rises that mechanical vibrations are generated in the electron optic system column 3 and the sample chamber 8. The stage is designed with a consideration of preventing the mechanical vibrations concomitant with the acceleration/deceleration of the stage from having an influence upon an inspection image but generation of changes with time is inevitable owing to abrasion and mechanical deterioration of movable parts.

A frequency of mechanical noise has a characteristic of its equality to the natural vibration frequency and its higher harmonics the vibrating part has. Accordingly, by grasping the frequency and the direction of a noise interfering in the inspection image, a vibrating part can be understood. Generally, the frequencies of mechanical noises are equal to or less than several kHz. Further, the vibration direction is determined depending on a vibrating portion in many cases and, therefore, understanding a vibration direction of an image noise is effective to identify a noise source. Thus, by analyzing a noise interfering in the inspection image to identify its cause and by performing proper maintenance, it is possible to improve the rate of operation of the apparatus. Also, the mechanical noise includes an electromagnetic noise due to an environment around the apparatus and an external disturbance noise such as floor vibration and, therefore, separation from these vibrations is necessary.

Figure 2:
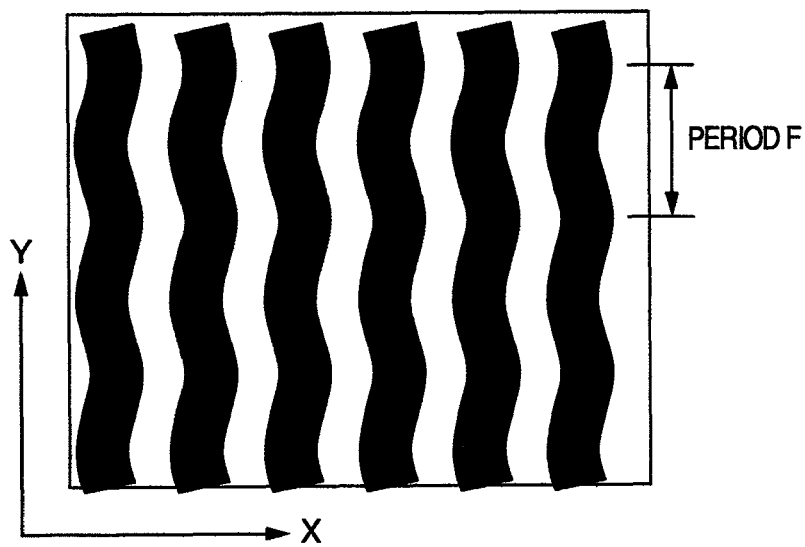
FIG. 2 is a screen diagram showing an example of an image displayed on a display of the circuit pattern inspecting apparatus.
Figure 3:
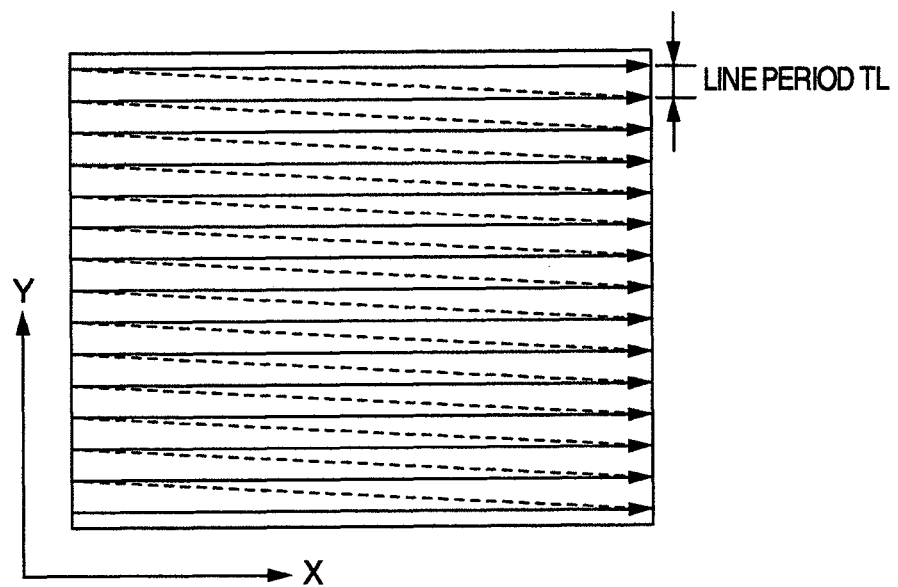
FIG. 3 is a plan view showing a scanning direction of a primary electron beam.
Figure 4:
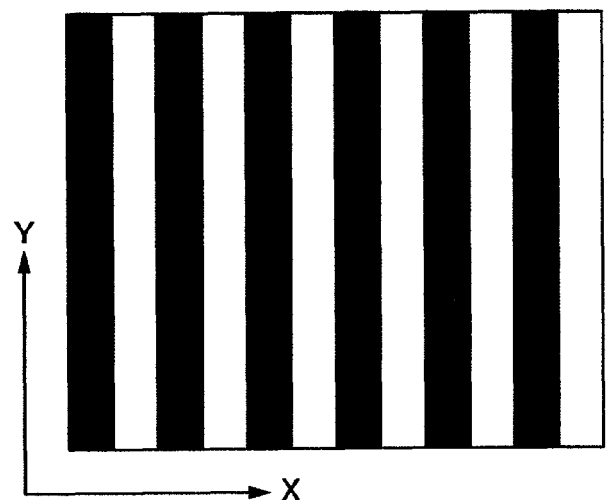
FIG. 4 is a screen diagram showing an example of an image displayed on the display of the circuit pattern inspecting apparatus.

FIG. 2 and FIG. 4 are screen diagrams showing examples of an image displayed on the display of the circuit pattern inspecting apparatus. FIG. 3 is a plan view showing a scanning direction of the primary electron beam. The acquired image shown in FIG. 2 is an image of a line-and-space pattern having its longitudinal direction lying in the Y direction, showing a situation of interference of a noise at a constant period F. The scanning period in the X direction shown in FIG. 3 is set to a line period TL.

Next, an image process is applied for the acquired image with the image processing circuit 46 of the image processing unit 5 to calculate a reference image. The reference image is an image in which a noise in a direction in which a noise analysis is carried out is removed. In the present embodiment, in order to perform a noise analysis in the X direction, the acquired image shown in FIG. 2 is summed in the Y direction to remove the noise in the X direction, producing a reference signal as shown in FIG. 4.

Subsequently, the overall control unit 49 of the image processing unit 5 calculates a correlation between the acquired image shown in FIG. 2 and the reference image shown in FIG. 4 to calculate a position drift amount in the X direction between the acquired image and the reference image. For the position drift amount, the acquired image is divided in the X direction and in respect of the individual divided areas a position drift amount of each scanning line is calculated.

Figure 5:
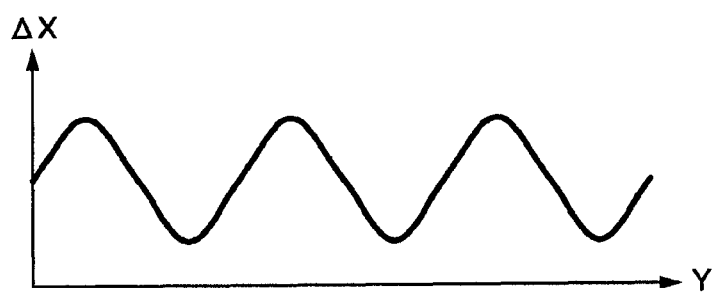
FIG. 5 is a graph plotting a calculated position drift amount with its abscissa representing a position drift amount $\Delta X$ and with its ordinate representing Y coordinates.

FIG. 5 is a graph plotting the calculated position drift amount with its abscissa representing the position drift amount $\Delta X$ and with its ordinate representing the Y coordinates. A trace of the graph indicates the noise contained in the image. Further, since the reference image shown in FIG. 4 is produced concurrently with the scan in the Y direction, the abscissa in FIG. 5 represents the Y coordinates and time simultaneously. Accordingly, the graph shown in FIG. 5 illustrates noise amounts at each line period TL. In other words, time series data obtained by sampling the image noise at period TL is illustrated.

Figure 6:
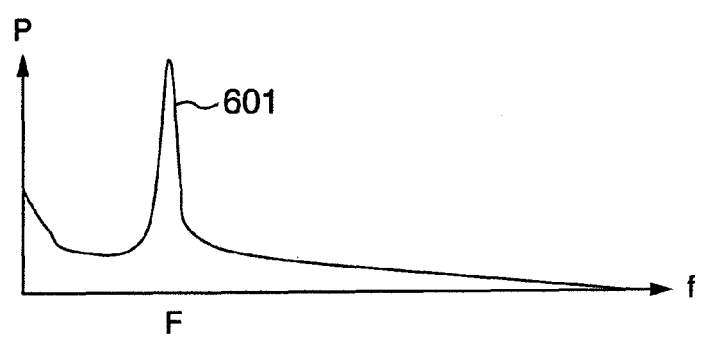
FIG. 6 is a graph of a frequency analysis performed by using a fast Fourier transform (FFT).

Next, a frequency analysis of the time series data of the noise amount as shown in the graph of FIG. 5 is performed. FIG. 6 is a graph of the frequency analysis executed by using a fast Fourier transform (FFT). The abscissa represents a frequency f and the ordinate represents a magnitude P of the signal. The result of the frequency analysis has a peak 601 at a specific frequency F as shown in FIG. 6. While in the present embodiment the frequency analysis is carried out by using the fast Fourier transform (FFT), other methods may be employed. Through the above procedures the frequency analysis of the noise in the X direction can be performed and the frequency analysis of the noise in the Y direction can also be performed in a similar method.

Figure 7:
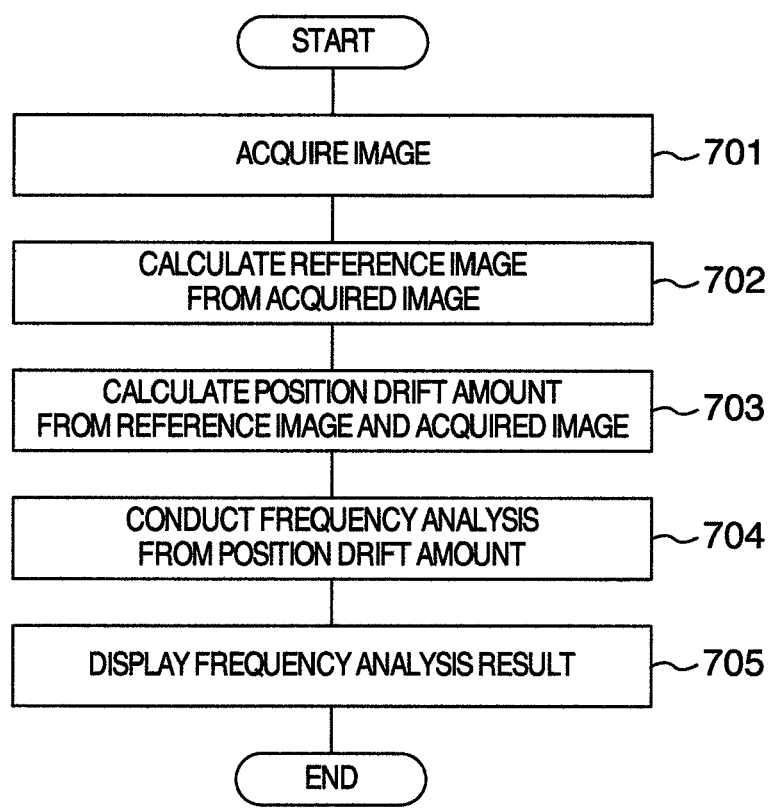
FIG. 7 is a flowchart showing procedures for the circuit pattern inspecting apparatus to perform the frequency analysis.

It is advantageous to make the circuit pattern inspecting apparatus execute the above noise frequency analysis automatically. FIG. 7 is a flowchart showing procedures for the circuit pattern inspecting apparatus to perform the frequency analysis. Individual processors of the image processing unit 5 are caused to execute the procedures shown in FIG. 7. In FIG. 7, an image is acquired (Step 701) and a processor of the image processing circuit 46 calculates a reference image by removing noises from the acquired image (Step 702). Next, a processor of the calculation section 48 calculates a correlation between the reference image and the acquired image to calculate a position drift amount (Step 703). Subsequently, a processor of the overall control unit 49 carries out a frequency analysis from the calculated position drift amount (Step 704). Finally, the result of the frequency analysis is displayed in the interface 6.

Figure 8:
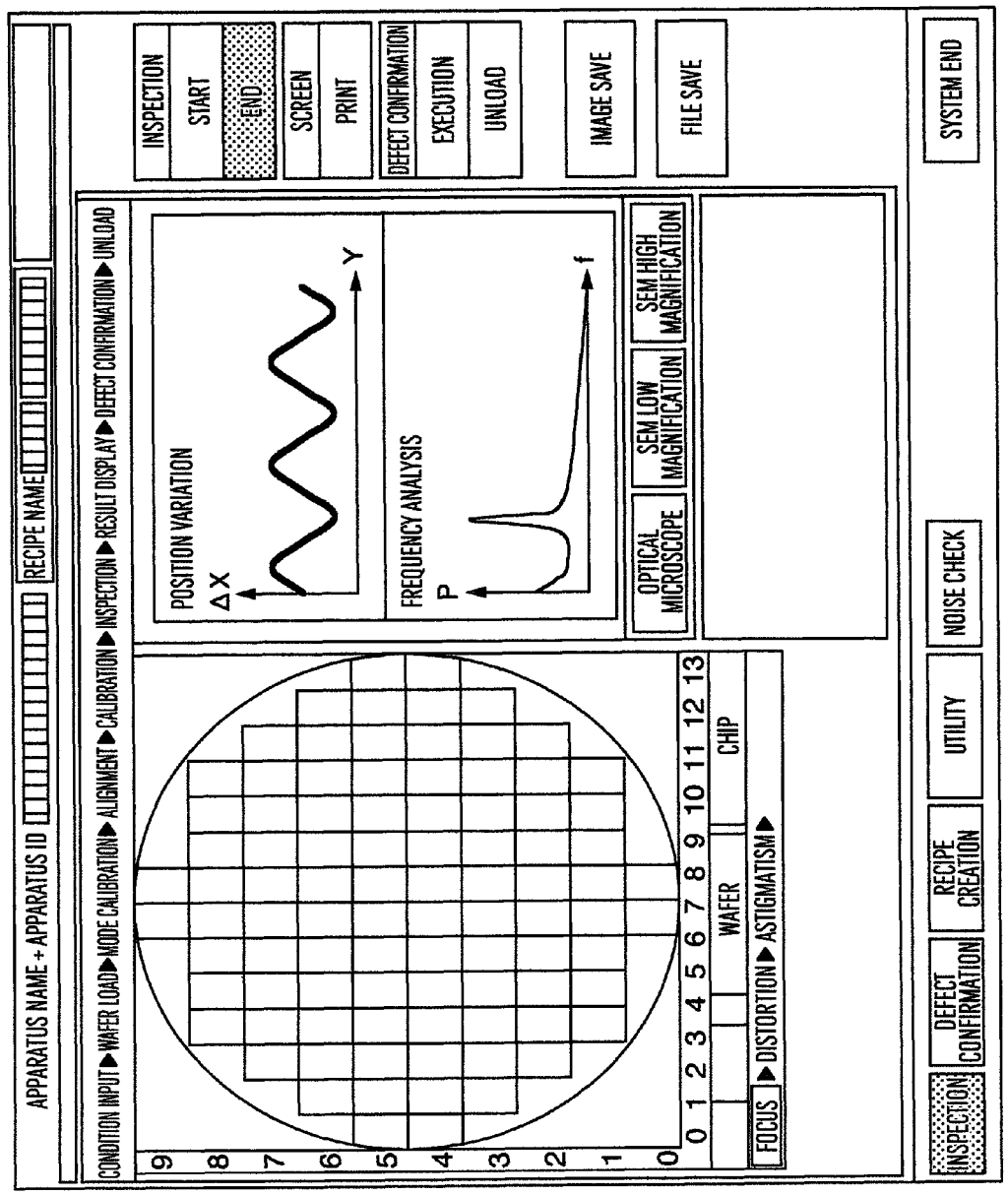
FIG. 8 is a screen diagram illustrating an example of the frequency analysis.

FIG. 8 is a screen diagram illustrating an example of the frequency analysis. The whole screen illustrates an example of the screen displayed in the interface 6 of the circuit pattern inspecting apparatus and on the left side of the screen a schematic diagram of a semiconductor wafer representing the inspection object substrate 9 is illustrated. In the right side region of the screen of the interface 6, the results of the frequency analysis shown in FIG. 5 and FIG. 6 are displayed, thus offering data useful for an operator to study causes of generation of the noise.

By using the method as described above the frequency of a noise component contained in the image and the direction of the noise can be grasped. A clue to identify a source of the noise deteriorating the performance of the circuit pattern inspecting apparatus can be obtained from the frequency and the direction of the image noise grasped herein.

In using the aforementioned method, the reference image is obtained by image summation to remove the noise from the acquired image. Therefore, a pattern which is always the same in the direction of summation such as a dot pattern of a uniform pitch, a pattern being periodic in the direction of summation, or a line-and-space pattern is necessary.

Besides, while in the present embodiment a method of calculating the reference image from the acquired image is chosen for the method for calculating the position drift amount of the image, other methods may be adopted such as a method in which an ideal image as a pattern of the acquired image is prepared as a dictionary image in advance and a position drift amount is calculated from the dictionary image and an acquired image actually obtained; still another method may be adopted in which a specific portion of an acquired image is set as a reference and a position drift amount from the reference is calculated.

Next, a method of managing the circuit pattern inspecting apparatus will be described. As noise components contained in an inspection image of the inspecting apparatus, there are noises which changes with time such as a mechanical noise and noises depending on the installation environment of the apparatus such as an external disturbance noise. When these noise amounts increase, noises contained in an inspection image also increase. Therefore, in order to maintain the performance of the circuit pattern inspecting apparatus stably, the amount and frequency of an image noise during normal operation needs to be grasped in advance. Also, as for the mechanical noise, movement of the stage conceivably becomes a vibration source and, therefore, the amount and frequency of the noise shall be acquired in advance at the respective conditions of the presence and the absence of stage movement. Further, as for the mechanical noise, it is necessary to grasp in advance natural frequencies of mechanical parts constituting the circuit pattern inspecting apparatus.

Figure 9:
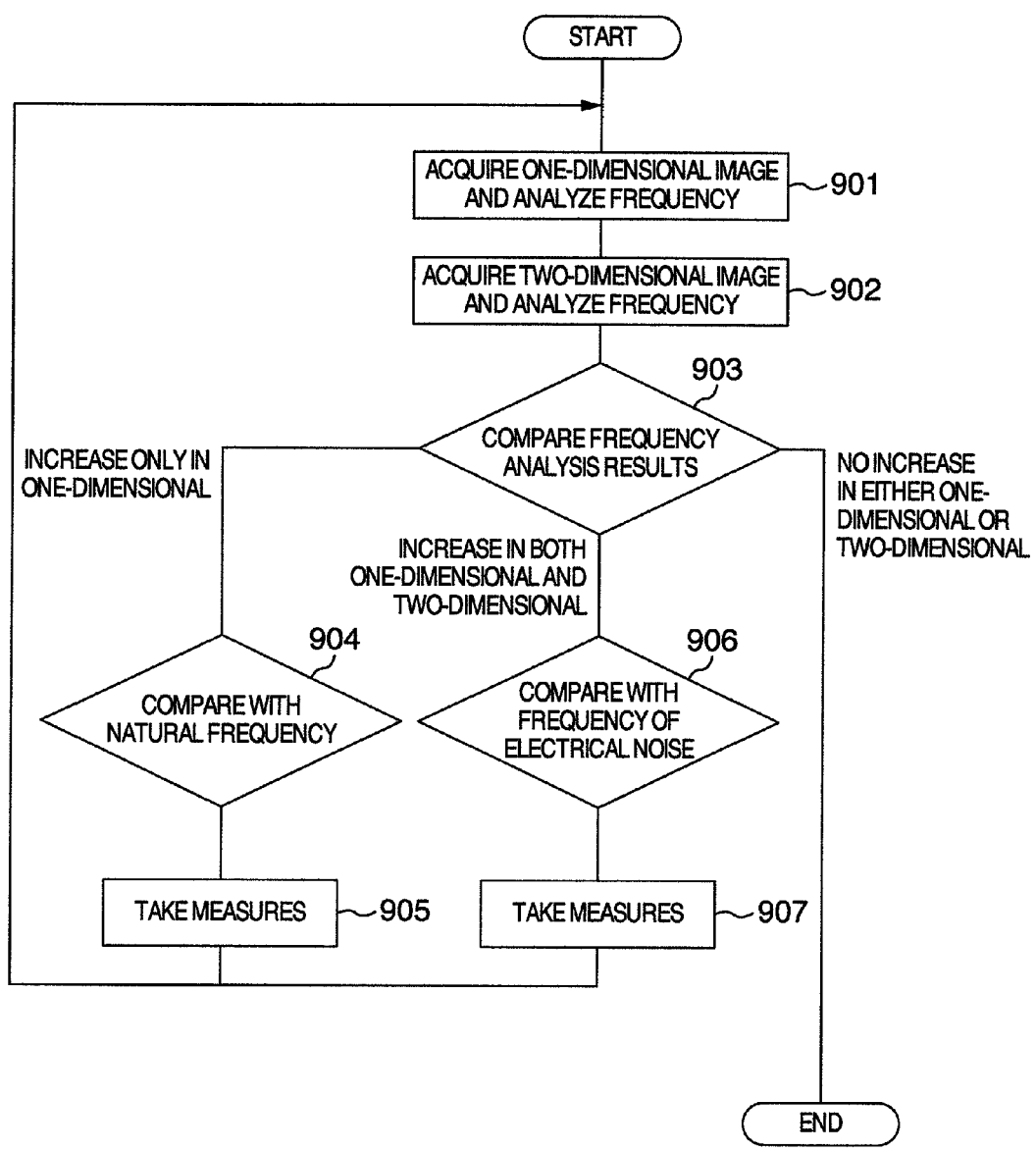
FIG. 9 is a flowchart showing procedures for the circuit pattern inspecting apparatus to perform another frequency analysis.

FIG. 9 is a flowchart showing procedures for the circuit pattern inspecting apparatus to perform a frequency analysis. First, a one-dimensional image is acquired while continuously moving the stage and the frequency analysis of the one-dimensional image is performed (Step 901). Next, with the stage stopped, a two-dimensional image is acquired and the frequency analysis of the two-dimensional image is performed (Step 902). Results of analyses of frequencies of the one-dimensional and two-dimensional images are compared to each other and peak frequencies are compared (Step 903). When the result of comparison shows that a characteristic peak is generated only in the one-dimensional image, it is considered generation of a mechanical noise of which the stage movement is a vibration source. In this case, there is a high possibility that a portion having a natural frequency in agreement with the peak frequency contained in the one-dimensional image vibrates. Accordingly, the peak frequency is compared with the natural frequency of the portion deemed to be the source of the mechanical noise (Step 904). Consequently, the portion considered as vibrating based on a result of the frequency analysis is identified and measures are taken (Step 905).

On the other hand, when a peak common to the results of frequency analyses of the one-dimensional image and the two-dimensional image arises, there is a high possibility that an electrical noise or a mechanical noise with a vibration source of vibrations by a vacuum pump or the floor is a cause of the image noise. Therefore, the peak frequency is compared with a frequency of an electrical noise considered as an electrical noise source or a natural frequency of a portion considered to be a mechanical noise source (Step 906). Consequently, the noise source is investigated using a clue of the frequency analysis result and measures are taken (Step 907). After completion of the investigation of noise source and the execution of measures, a one-dimensional image and a two-dimensional image are acquired again, frequency analyses are carried out (Steps 901 and 902), and in Step 903 peaks of the results of the frequency analyses of the one-dimensional image and the two-dimensional image are identified so as to verify the effect of the measures against the noise source. By using the above procedures, a noise contained in an image can be grasped quantitatively. In addition, a noise source of the image noise can be identified with high efficiency.

By performing the analyses of image noises described with FIG. 9 and displaying the results in the interface 6 shown in FIG. 8 to enable the operator to ascertain, noises developing as time elapses can be found earlier and early measures can be taken.

When a noise exists on an image, the degree of an influence upon the inspection result shall be studied to make a judgment as to whether an immediate action needs to be taken. In case an immediate action needs to be taken, measures are taken with clues of the frequency and the vibration direction of the noise. Whether the measures are sufficient or not can be determined by examining the noise amount after the measures.

On the other hand, when the operator judges that immediate actions are unnecessary, the circuit pattern inspecting apparatus is operated while the periodical acquisition of noise amounts is continued. Some of mechanical noises increase due to abrasion of moving portions as the time elapses. In this case, a noise of a frequency equal to a natural frequency of the parts being abraded is expected to increases gradually. Accordingly, the abrasion of the objective parts can be estimated from the amount of the noise corresponding to the natural frequency of the parts undergoing abrasion. Therefore, by acquiring the image noise periodically and analyzing it statistically, time to replace the parts subject to abrasion can be grasped in advance and proper maintenance can be executed to permit the circuit pattern inspecting apparatus to be operated stably for a long time.

When the above procedures are automated and the function to grasp the image noise periodically is provided, time change of the image noise can be grasped. Further, by preparing the natural frequencies of parts constituting the apparatus and the frequencies responsible as the electrical noise sources as a noise source database and by collating a peak frequency with the noise source database, a judgment made by the operator can be carried out automatically.

Figure 10:
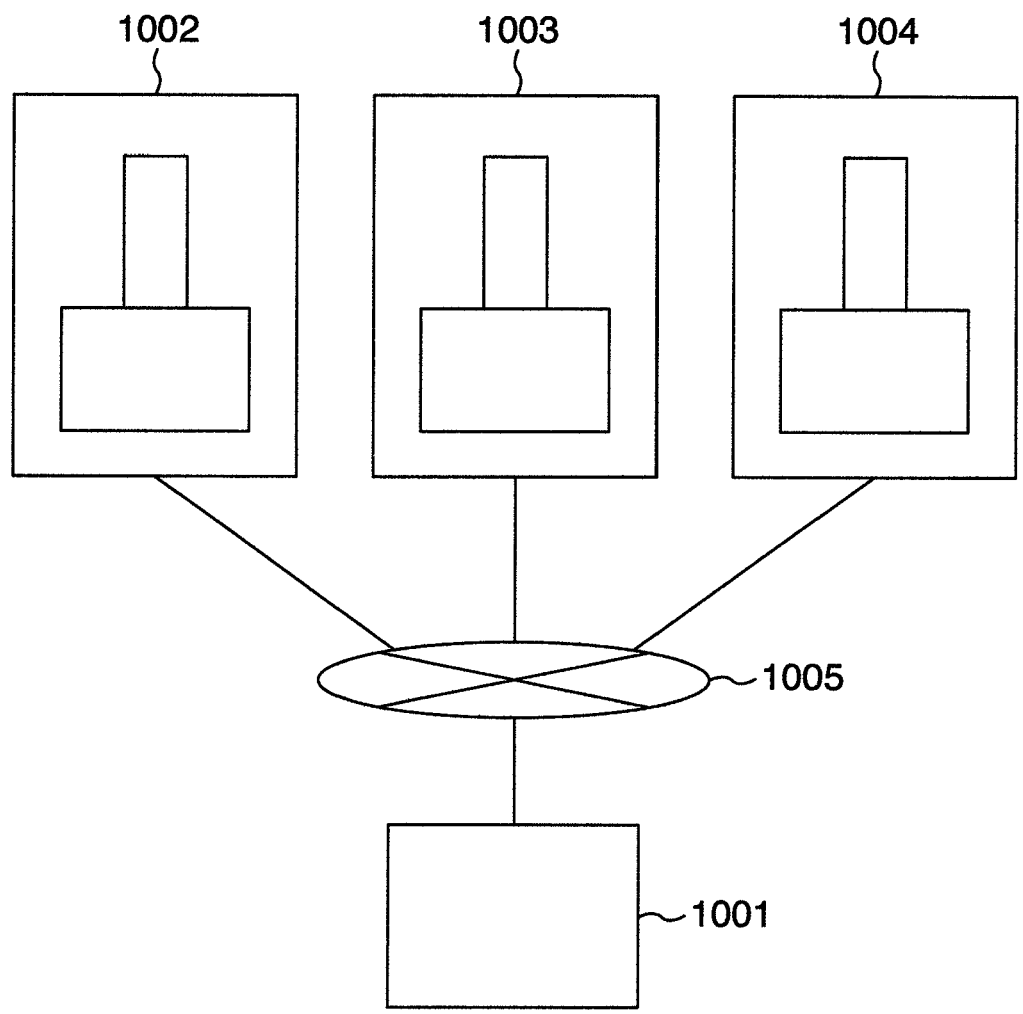
FIG. 10 is a diagram illustrating a system for managing a plurality of circuit pattern inspecting apparatuses.

FIG. 10 is a diagram illustrating a system for managing a plurality of circuit pattern inspecting apparatuses. A management apparatus 1001 is connected with plural circuit pattern inspecting apparatuses 1002, 1003, and 1004 via a communication network 1005 such as a local area network.

Each of the plural circuit pattern inspecting apparatuses 1002, 1003, and 1004 executes the analysis of the frequency of an image noise automatically. Also, the results of the analyses and a status of each apparatus are transmitted to the management apparatus 1001 via the communication network 1005 and stored in a time-series fashion.

Since the management apparatus 1001 has a function to statistically process and display the results of frequency analyses of the plural circuit pattern inspecting apparatuses, the operator can check the presence/absence of a change with time of the noise amount and can manage the apparatus statuses. For example, on the display provided for the management apparatus 1001, the frequency analysis results for the plural circuit pattern inspecting apparatuses are displayed in an array of time series. Further, when the management apparatus 1001 automatically displays a change with time of a designated noise frequency with emphasis by discriminating from others such as using different colors, the operator can recognizes the change immediately. Further, when the management apparatus 1001 calculates the contents and the timing of maintenance necessary for the apparatus from the change with time of the frequency analysis result of each apparatus and the status of operation of each apparatus and displays them on the display, a fault of the apparatus can be found and measures are taken early.

Causes can sometimes be identified by centralized management of the plural circuit pattern inspecting apparatuses. The electrical noise and the mechanical noise are those inherent to the apparatus and they can hardly be considered to increase in the plural apparatuses at a time. Accordingly, in the event that image noises having a specific frequency increase suddenly in common to the plural circuit pattern inspecting apparatuses, the cause of the change in the image noise amounts can be presumed as originating from external disturbance noise caused by floor vibration, electromagnetic wave noise around the apparatuses, and the like. The management apparatus 1001 displays the sudden noise with emphasis as discriminating it from other noises so that the operator can easily recognize the sudden noise. In this manner, through the centralized management of the plural circuit pattern inspecting apparatuses, not only abnormality of each apparatus but also whether the cause is external disturbance or not can be managed.

According to the present invention, by measuring the image noise of the inspecting apparatus and perceiving a sign that the status of the apparatus will become abnormal, a judgment can be made as to whether maintenance is necessary or unnecessary and as to the contents of the maintenance, thereby ensuring that the rate of operation of the inspecting apparatus can be prevented from being decreased.

Reference Signs List

1 circuit pattern inspecting apparatus
5 image processing unit
6 interface
9 inspection object substrate
19 primary electron beam
34 position monitor length measuring device
46 image processing circuit
47 defect data buffer
49 overall control unit
55 map display section
56 image display section
61 correction control circuit
1001 management apparatus
1005 communication network

The invention claimed is:

1. A circuit pattern inspecting apparatus, which detects secondary electrons or back scattering electrons generated by irradiating an electron beam on a substrate having a circuit pattern formed thereon and detects an abnormality of said circuit pattern, comprising:
an image processing unit for generating an acquired image based on an intensity of a signal of said detected secondary electrons or back scattering electrons, and generating a reference image by removing a noise component from said acquired image; and
a control unit for extracting said noise component included in said acquired image based on a comparison of the acquired image with the reference image, and performing a frequency analysis on said extracted noise component.

2. The circuit pattern inspecting apparatus according to claim 1, wherein:
said image processing unit sums a plurality of said acquired images to generate a reference image; and
said control unit compares said reference image and said acquired image with each other to determine a position drift amount and performs a frequency analysis of said position drift amount.

3. The circuit pattern inspecting apparatus according to claim 2, further comprising a sample stage for mounting said substrate, and
wherein said electron beam is irradiated on said substrate while moving said sample stage continuously.

4. The circuit pattern inspecting apparatus according to claim 2, further comprising a sample stage for mounting said substrate, and
wherein said electron beam is irradiated on said substrate while stopping said sample stage at a desired position.

5. The circuit pattern inspecting apparatus according to claim 1, wherein:
said image processing unit saves a dictionary image in advance; and
said control unit compares said dictionary image and said acquired image with each other to determine a position drift amount and performs a frequency analysis of said position drift amount.

6. The circuit pattern inspecting apparatus according to claim 1, further comprising a man-machine interface for displaying results of said frequency analysis.

7. The circuit pattern inspecting apparatus according to claim 1, wherein said control unit performs said frequency analysis for each of two orthogonal coordinate systems of said acquired image.

8. The circuit pattern inspecting apparatus according to claim 1, wherein said frequency analysis uses a fast Fourier transform.

9. The circuit inspecting apparatus according to claim 1, wherein said image processing unit sums said acquired image in a direction perpendicular to a direction of performing said frequency analysis to generate said reference image.

10. A management system including a plurality of circuit pattern inspecting apparatuses connected with a management apparatus via a communication medium, in which
each circuit pattern inspecting apparatus comprises:
an image processing unit for generating an acquired image by detecting secondary electrons or back scattering electrons generated by irradiating an electron beam on a substrate having a circuit pattern formed thereon and generating a reference image by removing a noise component from said acquired image; and
a control unit for extracting the noise component based on a comparison of said acquired image with said reference image,
wherein said management apparatus receives results of a frequency analysis of the extracted noise components contained in the acquired images generated by said circuit pattern inspecting apparatuses,
wherein said management apparatus receives a status of operation of each said circuit pattern inspecting apparatus, and
wherein said management apparatus displays on a display section a change with time of the extracted noise components contained in the acquired images generated by said circuit pattern inspecting apparatuses.

11. The management system including circuit pattern inspecting apparatus according to claim 10, wherein
said management apparatus acquires periodically results of the frequency analyses of said acquired image generated by each said circuit pattern inspecting apparatus, and analyzes contents and time of maintenance of each said circuit pattern inspecting apparatus based on a change with time of said results of the frequency analysis.

12. The management system including circuit pattern inspecting apparatus according to claim 10, wherein said management apparatus gives a discriminative display on said display section by discriminating between an instance where the frequency of a noise component contained in an acquired image of a circuit pattern inspecting apparatus is in common to a plurality of apparatuses and an instance where the frequency of said noise component is specific to a single apparatus.

13. The management system including circuit pattern inspecting apparatus according to claim 10, wherein said frequency analysis uses a fast Fourier transform.

14. The management system including circuit pattern inspecting apparatus according to 10, wherein said management apparatus displays on a display results of the frequency analysis by said plurality of circuit pattern inspecting apparatuses in an array of time series.

15. The management system including circuit pattern inspecting apparatus according to claim 10, wherein said management apparatus displays on a display a change with time of a designated noise frequency with emphasis by discriminating from others.

16. The management system including circuit pattern inspecting apparatus according to claim 10, wherein said management apparatus displays on a display a sudden noise with emphasis as discriminating it from other noises.

17. A method for inspecting a circuit pattern by detecting secondary electrons or back scattering electrons generated by irradiating an electron beam on a substrate having a circuit pattern formed thereon and detecting an abnormality of said circuit pattern, comprising:
generating an acquired image based on a signal intensity of said detected secondary electrons or back scattering electrons;
generating a reference image by removing a noise component from said acquired image;
extracting the noise component included in said acquired image based on a comparison of said acquired image with said reference image; and
performing a frequency analysis on said extracted noise component.

18. The circuit pattern inspecting method according to claim 17, further comprising:
generating said reference image by summing a plurality of acquired images;
determining a position drift amount by comparing said reference image and said acquired image; and
performing a frequency analysis of said position drift amount.

19. The circuit pattern inspecting method according to claim 18, further comprising:
irradiating said electron beam on said substrate while continuously moving a sample stage on which said substrate is mounted.

20. The circuit pattern inspecting method according to claim 18, further comprising:
irradiating said electron beam on said substrate while stopping at a desired position a sample stage on which said substrate is mounted.

21. The circuit pattern inspecting method according to claim 17, further comprising:
saving a dictionary image in advance;
determining a position drift amount by comparing said dictionary image and said acquired image; and
performing a frequency analysis of said position drift amount.

22. The circuit pattern inspecting method according to claim 17, further comprising:
displaying results of said frequency analysis in a man-machine interface.

23. The circuit pattern inspecting method according to claim 17, wherein said frequency analysis is performed for each of two orthogonal coordinate systems of said acquired image.

24. A method for inspecting a circuit pattern in a management system including a plurality of circuit pattern inspecting apparatuses connected with a management apparatus via a communication medium, comprising:
generating an acquired image by each circuit pattern inspecting apparatus by detecting secondary electrons or back scattering electrons generated by irradiating an electron beam on a substrate having a circuit pattern formed thereon;
generating a reference image for each acquired image by removing a noise component from said acquired image;
extracting the noise component included in each acquired image based on a comparison of said acquired image with the corresponding reference image;
performing a frequency analysis on each extracted noise component;
receiving by said management apparatus results of the frequency analysis of the extracted noise components contained in the acquired images generated by said circuit pattern inspecting apparatuses;
receiving by said management apparatus a status of operation of each of said circuit pattern inspecting apparatus; and
displaying by said management apparatus on a display section a change with time of the noise components contained in the acquired images generated by said circuit pattern inspecting apparatuses.

25. The circuit pattern inspecting method according to claim 24, further comprising:
acquiring periodically by said management apparatus results of the frequency analyses of said acquired image generated by each of said circuit pattern inspecting apparatus; and
analyzing by said management apparatus contents and time of maintenance of each of said circuit pattern inspecting apparatus based on a change with time of said results of the frequency analysis.

26. The circuit pattern inspecting method according to claim 24, further comprising:
giving a discriminative display by said management apparatus on said display section by discriminating between an instance where the frequency of a noise component contained in an acquired image of a circuit pattern inspecting apparatus is in common to a plurality of apparatuses and an instance where the frequency of said noise component is specific to only a single apparatus.

* * * * *